United States Patent
Brilka et al.

(10) Patent No.: US 7,233,368 B2
(45) Date of Patent: Jun. 19, 2007

(54) DOWN-CONVERTER

(75) Inventors: Joachim Brilka, Hamburg (DE);
Thomas Hafemeister, Hamburg (DE);
Wolfgang Weltersbach, Hamburg (DE)

(73) Assignee: NXP B.V., Eindhoven (NL)

( * ) Notice: Subject to any disclaimer, the term of this patent is extended or adjusted under 35 U.S.C. 154(b) by 519 days.

(21) Appl. No.: 10/477,482

(22) PCT Filed: May 8, 2002

(86) PCT No.: PCT/IB02/01618

§ 371 (c)(1),
(2), (4) Date: Nov. 12, 2003

(87) PCT Pub. No.: WO02/096099

PCT Pub. Date: Nov. 28, 2002

(65) Prior Publication Data
US 2004/0130483 A1    Jul. 8, 2004

(30) Foreign Application Priority Data
May 11, 2001  (DE) ................................ 101 22 830

(51) Int. Cl.
*H04N 5/50* (2006.01)
(52) U.S. Cl. .................................................... 348/725
(58) Field of Classification Search ................ 348/725, 348/731–733, 726; 455/302, 304, 318, 179.1
See application file for complete search history.

(56) References Cited

U.S. PATENT DOCUMENTS

| | | | |
|---|---|---|---|
| 4,944,025 A * | 7/1990 | Gehring et al. ............. 455/207 |
| 5,140,198 A * | 8/1992 | Atherly et al. .............. 327/113 |
| 5,619,206 A * | 4/1997 | Cole et al. ..................... 342/37 |
| 5,870,670 A * | 2/1999 | Ripley et al. ................ 455/304 |
| 5,937,341 A * | 8/1999 | Suominen .................... 455/324 |
| 5,999,793 A * | 12/1999 | Ben-Efraim et al. .......... 725/68 |
| 6,091,931 A * | 7/2000 | Ben-Efraim et al. ....... 455/3.02 |
| 6,160,858 A * | 12/2000 | Hindman et al. ........... 375/336 |
| 6,304,140 B1 * | 10/2001 | Thron et al. ................. 330/149 |
| 6,356,736 B2 * | 3/2002 | Tomasz et al. ............ 455/3.02 |
| 6,377,315 B1 * | 4/2002 | Carr et al. ................... 348/726 |
| 6,477,477 B1 * | 11/2002 | Thron et al. ................... 702/86 |
| 6,678,012 B1 * | 1/2004 | Belotserkovsky ........... 348/731 |
| 6,892,060 B2 * | 5/2005 | Zheng ......................... 455/302 |

* cited by examiner

*Primary Examiner*—Paulos Natnael

(57) ABSTRACT

A down-converter for processing frequency signals, preferably received, particularly digital, television signals, comprising two, preferably identical mixer stages (10a, 10b) for down-converting the signal, a local oscillator (12) controlling the mixer stages by a 90° phase shift, a complex filter (14) which couples the output signals of the mixer stages (10a, 10b) by means of a complex filtering method in such a way that the signal components outside a predetermined useful band are substantially suppressed, an adjusting device (13) for adjusting the frequency of the local oscillator (12) and a subsequent low-pass filter.

16 Claims, 4 Drawing Sheets

DOWN-CONVERTER

The invention relates to a down-converter or frequency converter for processing frequency signals, preferably received, particularly digital, television signals, particularly for converting the frequency.

A main field of application of such a down-converter is its use in, for example, digital video broadcast (DVB) systems in mainly radio frequency (RF) and intermediate frequency (IF) stages at the receiver front end such as, for example, in a DVB receiver, a set top box or a video card built in a personal computer.

Particularly for said applications, the current down-converters have an elaborate structure due to the use of an LC-VCO, discrete low-pass filters and cascaded SAW filters, or of RC components. The use of an I/Q demodulator with two A/D converters and a digital error correction has also been proposed.

Reference is made to the prior art in the article "Front End Architectures for Multi-standard Digital TV Receivers" in IEEE Transactions on Consumer Electronics, vol. 46, no. 3, August 2000, and to EP 0 963 110 A2.

The currently used circuits do not only have an elaborate structure with numerous critical external components but also require an equalization. Finally, the use in different television standards is accompanied by problems.

It is an object of the present invention to provide a substantially fully integrated circuit without the requirement of equalization, instead of the applications hitherto known.

This object is solved in that a device of the type described in the opening paragraph comprises two, preferably identical, mixer stages for down-converting the signal, a local oscillator controlling the mixer stages by a 90° phase shift, a complex filter which couples the output signals of the mixer stages by means of a complex filtering method in such a way that the components of the signal outside a predetermined useful band are substantially suppressed.

Accordingly, the signal is supplied to two, preferably identical mixer stages for down-conversion, which are only distinguished by the fact that the control by the local oscillator is 90° phase-shifted. According to the invention, the output signals of the mixer stages are further coupled together in a complex filtering method in such a way that the signal components outside the useful band are suppressed, dependent on whether the frequency of the local oscillator with respect to the useful band is either below or above the local oscillator frequency.

The invention provides a concept which is free from equalization and can be implemented in a fully integrated circuit. The down-converter according to the invention can therefore be integrated, for example, also in hybrid receivers for analog and digital television transmission. When using a digital IF demodulator, the invention is also suitable for implementation in the IF frequency stage for processing analog IF television signals.

The number of components is thus clearly reduced and the application in a RF receiver section is considerably simplified. In an overall system with a tuner and a digital channel decoder, a better performance (sensitivity) and robustness in the case of strong interference signals is achieved.

The complex filter preferably comprises a broadband phase shifter generating a phase shift between the output signals of the mixer stages by a further 90° in the desired frequency band, and an adder adding the 180° mutually phase shifted output signals of the phase shifter. Accordingly, the two mixer stages supply the signals converted to a low frequency as I and Q signals so that, dependent on the sideband, the phase either leads or trails by 90°. The phase shifter generates a further 90° phase shift between the I signal and the Q signal throughout the frequency band so that a 0° phase difference between the I and Q signals is obtained for one sideband and a 180° phase difference between the I and Q signals is obtained for the other sideband. After addition of these two signals in the adder, one sideband is gained whereas the other is suppressed. In this respect it is to be noted that only the relative phase shift rather than the absolute one is of significance. The reason is that only the relative (very small) tolerances rather than the absolute (large) tolerances play a role in an integrated realization. Accordingly, no frequency control is required so that neither any controllable time constants are necessary in the signal branch. Since an absolute R-C spread up to +/−30% is admissible, the circuit structure does not have to be subjected to too stringent quality requirements.

The phase shifter suitably comprises a first phase shifter branch for processing the output signal of one mixer stage and a second phase shifter branch for processing the output signal of the other mixer stage. Usually, the two phase shifter branches are arranged in a cascade configuration. Furthermore, each phase shifter branch may comprise at least one all-pass filter. In a cascade configuration, each phase shifter branch preferably comprises three all-pass-based phase shifter stages.

An adjusting device for adjusting the frequency of the local oscillator is preferably provided. The frequency of the local oscillator can thereby be maintained adjustable so that an adaptation to the IF frequency locations of different standards will be possible. Since the frequency of the local oscillator is thus adjustable by means of the adjusting device, the invention in this embodiment is suitable, for example, for all DVB standards.

In one embodiment, which is currently particularly preferable, the adjusting device comprises a synthesizer, particularly a PLL synthesizer by which the frequency of the local oscillator can be adjusted very exactly.

The adjusting device is to adjust the frequency of the local oscillator in such a way that the frequency of a signal component, preferably with a high level, adjacent to the useful band is at least substantially reduced to zero. Accordingly, the frequency of the local oscillator is advantageously selected in such a way that high level signal components adjacent to the useful band substantially or completely fall back to the "zero" frequency. In the case of a digital television system, this relates to, for example, the picture carrier or the sound carrier of an analog television transmitter.

The adjusting device should, for example, adjust the frequency of the local oscillator to a value of 250 kHz above a possible analog adjacent picture carrier. In this case, it is assumed that these frequencies are related to a signal in the first IF range in which the frequency assignment is reversed in a first process of frequency conversion by means of a tuner. To this end, local oscillator frequencies are concerned which, for the different worldwide standards, are preferably 250 kHz above a possible analog adjacent picture carrier and, as regards frequency, are thereby below the frequency of the useful signal applied to the mixer stages.

After complex filtering in the filter, the signal frequencies that are still close to zero but not yet suppressed by means of the complex filtering method can be removed in a high-pass filtering operation. This relates to, for example, the residual modulation components of an analog adjacent picture and sound carrier.

The other band side may advantageously be selected in a low-pass filtering operation. The low-pass filter to be used for this purpose is preferably formed as an adjustable tracking low-pass filter so that the multi-standard possibility provided by the invention can even be increased for the further useful bandwidths of the standard.

Moreover, the individual stages of the down-converter according to the invention may be supplemented by corresponding delay equalizers to be adapted to the requirements imposed on the realized stages so as to obtain an optimum group delay behavior in the overall system. Preferably, delay equalizations for the complex filter and the low-pass filter are provided.

These and other aspects of the invention are apparent from and will be elucidated with reference to the embodiments described hereinafter.

In the drawings:

FIG. 1 is a block diagram of a circuit arrangement in which the RF signal RF is converted into an output signal S via an IF signal IF.

Figure 1:
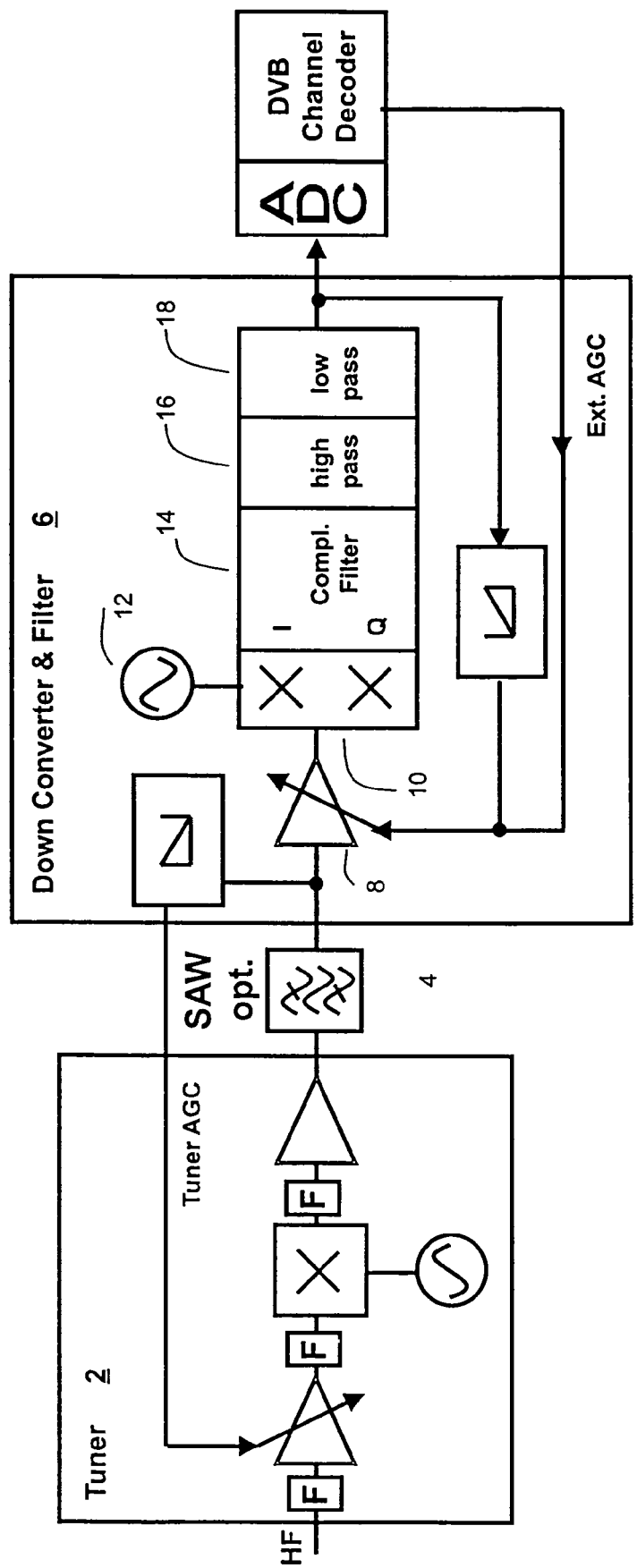
FIG. 1 is a block diagram of a circuit arrangement comprising a tuner, a surface acoustic wave filter, a down-converter, an A/D converter and a DVB channel decoder.

To this end, the circuit arrangement of FIG. 1 comprises a channel selector or tuner 2 in which the spectrum of the RF input signal RF is converted into an IF frequency range. In the embodiment shown, the tuner 2 precedes a surface acoustic wave filter 4 which frees the IF output signal IF of the tuner 2 from unwanted adjacent channel signals. The surface acoustic wave filter 4 may be optionally provided, dependent on the requirements imposed on the system.

The tuner 2 and the SAW filter 4, if any, precedes a down-converter 6. In the embodiment shown, the down-converter 6 comprises, at its input, a controllable amplifier 8 in which the IF signal IF is initially adjusted at a normalized level. The leveled signal thus normalized is subsequently applied to a mixer 10 to which a local oscillator 12 is connected.

Figure 2:
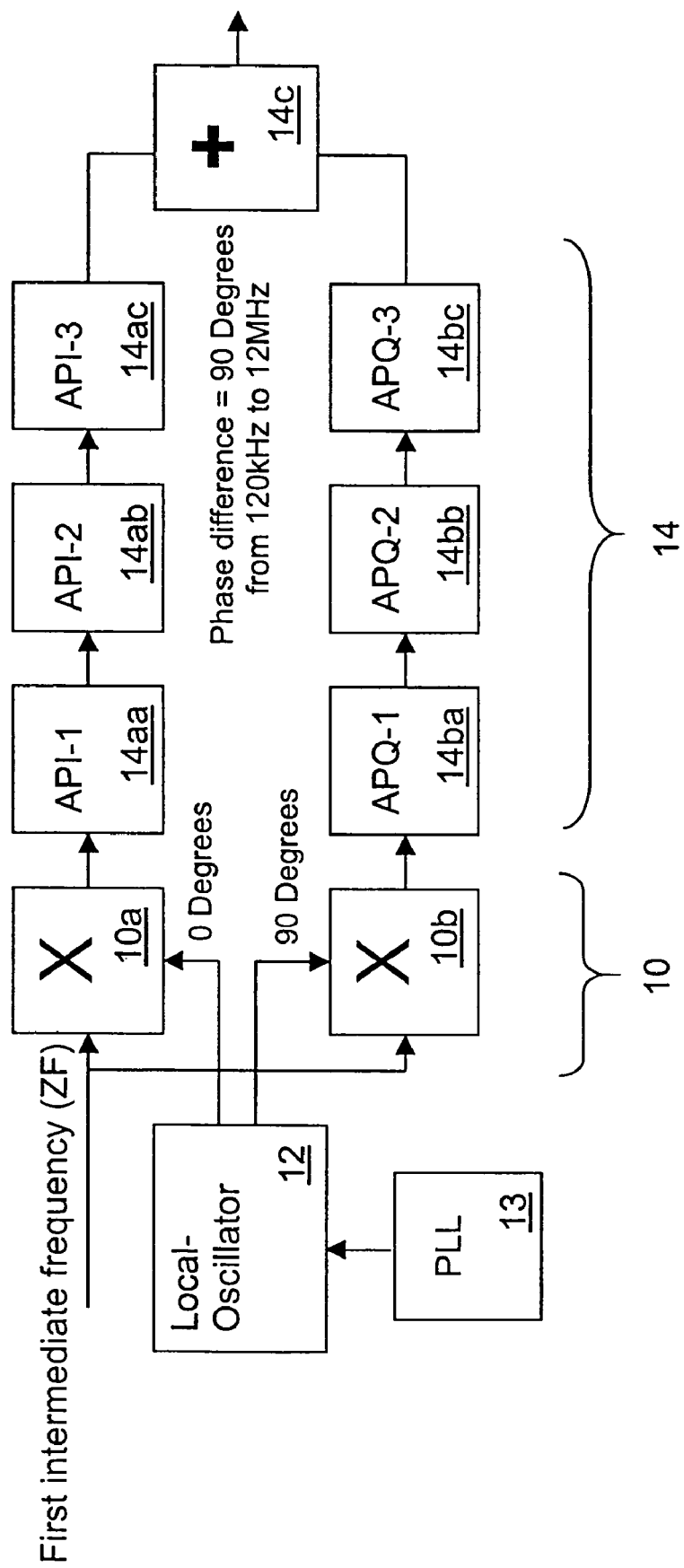
FIG. 2 is a block diagram of a circuit arrangement in the down-converter, comprising two mixer stages, a local oscillator and a complex filter in a preferred embodiment.

As is shown in FIG. 2, the mixer 10 comprises two identical mixer stages 10a and 10b which are only distinguished in that the control by the local oscillator 12 is 90° phase-shifted. To this end, the local oscillator 12 supplies two exactly orthogonal signals (in-phase I and quadrature Q). Thus, the in-phase (I) branch of the first mixer stage 10a receives, on the one hand, the intermediate frequency signal IF adjusted at a constant amplitude, which IF signal is a DVB signal, and, on the other hand, the in-phase signal from the local oscillator 12, and the quadrature (Q) branch of the second mixer stage 10b receives, on the one hand, (also) the intermediate frequency signal IF and, on the other hand, the quadrature signal from the local oscillator 12. As a result, the two mixer stages 10a, 10b supply a signal converted to a low frequency also as an I and a Q signal, namely in such a way that, dependent on the sideband, the phase leads or trails by 90° in the intermediate frequency.

In the embodiment shown, the local oscillator 12 is controlled by a phase-locked loop (PLL) synthesizer 13. The frequency of the local oscillator 12 is maintained adjustable by the synthesizer technique of the PLL synthesizer 13 and thus allows an adaptation to the IF ranges of different television standards.

The output signals I and Q of the mixer 10 are applied to a complex filter 14 in which they are coupled together by means of a complex filtering method in such a way that the signal components outside the useful band are suppressed, namely in dependence upon whether the frequency of the local oscillator 12 with respect to the useful band is either below or above the frequency of the local oscillator 12.

As is shown in FIG. 2, the complex filter 14 has a phase shifter cascade configuration in the I branch and in the Q branch, which cascade comprises, in the embodiment shown, three all-pass filters or all-pass-based phase shifter stages 14aa, 14ab, 14ac and 14ba, 14bb, 14bc which can each shift the phase in the range between 0° and −180° and whose cut-off frequencies and hence transition points are dimensioned in such a way that a linear increase of the phase is the result throughout the relevant frequency range. Moreover, the cut-off frequencies are dimensioned in such a way that the phase difference between the I branch and the Q branch is constantly 90° throughout the frequency range. In this respect it is not the absolute phase shift but the relative phase shift which is important. When the frequency range, in which this is fulfilled, has now been selected to be broad enough, only the relative (very small) tolerances, rather than the absolute (large) tolerances play a role as regards an integrated realization.

Since a phase shift of a further 90° throughout the relevant frequency band is generated by the phase shifter cascades in the complex filter 14 between the I and Q output signals of the mixer 10, a 0° phase difference for one sideband and a 180° phase difference for the other sideband is obtained between the I and Q branches.

Subsequently, both signals from the I and Q branches are applied to an adder 14c which also forms part of the complex filter 14, as is shown in FIG. 2. By adding the two signals, one sideband is gained whereas the other is suppressed.

The frequency of the local oscillator 12 is advantageously chosen to be such that high level signal components adjacent to the useful band are reduced to the zero frequency. In the case of a digital television system, this relates, for example, to the picture carrier or the sound carrier of an analog television transmitter. It is assumed that these frequencies relate to a signal in the first IF range in which the frequency assignment is reversed in a first process of frequency conversion process by means of a tuner.

For the local oscillator 12, the synthesizer technique of the PLL synthesizer 13 should allow selection of those local oscillator frequencies that are located preferably 250 kHz above a possible analog adjacent picture carrier for the different worldwide standards and, as regards frequency, are thus below the useful signal.

The output of the complex filter 14 is connected to a high-pass filter 16 in which the signal frequencies that are still close to zero but not yet suppressed by means of the complex filtering method are removed by high-pass filtering, for example, the residual modulation components of an analog adjacent picture and sound carrier, dependent on the frequency location of the local oscillator 12.

One band side of the useful signal is selected by means of the previously described combination of complex filter 14 and high-pass filter 16.

The other band side is selected in a low-pass filtering operation for which the high-pass filter 16 precedes a low-pass filter 18 in the embodiment shown (see FIG. 1). In the embodiment shown, this low-pass filter 18 is formed as an adjustable and integrated tracking low-pass filter. The width of the selected band is particularly adapted to the selected bandwidth of the low-pass filter 18. The multi-standard possibility of the embodiment described is thereby completed for the different useful bandwidths of the standard.

The individual stages of the down-converter 6 shown diagrammatically in FIG. 1 may be further supplemented by corresponding delay equalizers (not shown in the Figures) which should each be adapted to the requirements imposed on the individual stages so as to obtain an optimum group delay behavior in the overall down-converter 6. Such delay equalizers should preferably be installed for the complex filter 14 and the low-pass filter 18.

The down-converter 6 described hereinbefore is preferably a DVB-T down-converter which converts the DVB spectrum of the first intermediate frequency of a frequency band, which is in the range between 30 and 60 MHz and has a bandwidth of between 6 and 8 MHz, to a frequency band of 1 to 7/8/9 MHz. In this case, the frequency of the local oscillator 12 is controlled for the conversion by the PLL synthesizer 13 to a value of 1 MHz below the DVB frequency band.

The output signal S of the down-converter 6 is then supplied for further processing to a DVB channel decoder 22 via an A/D converter 20, as is apparent from FIG. 1.

Figure 3:
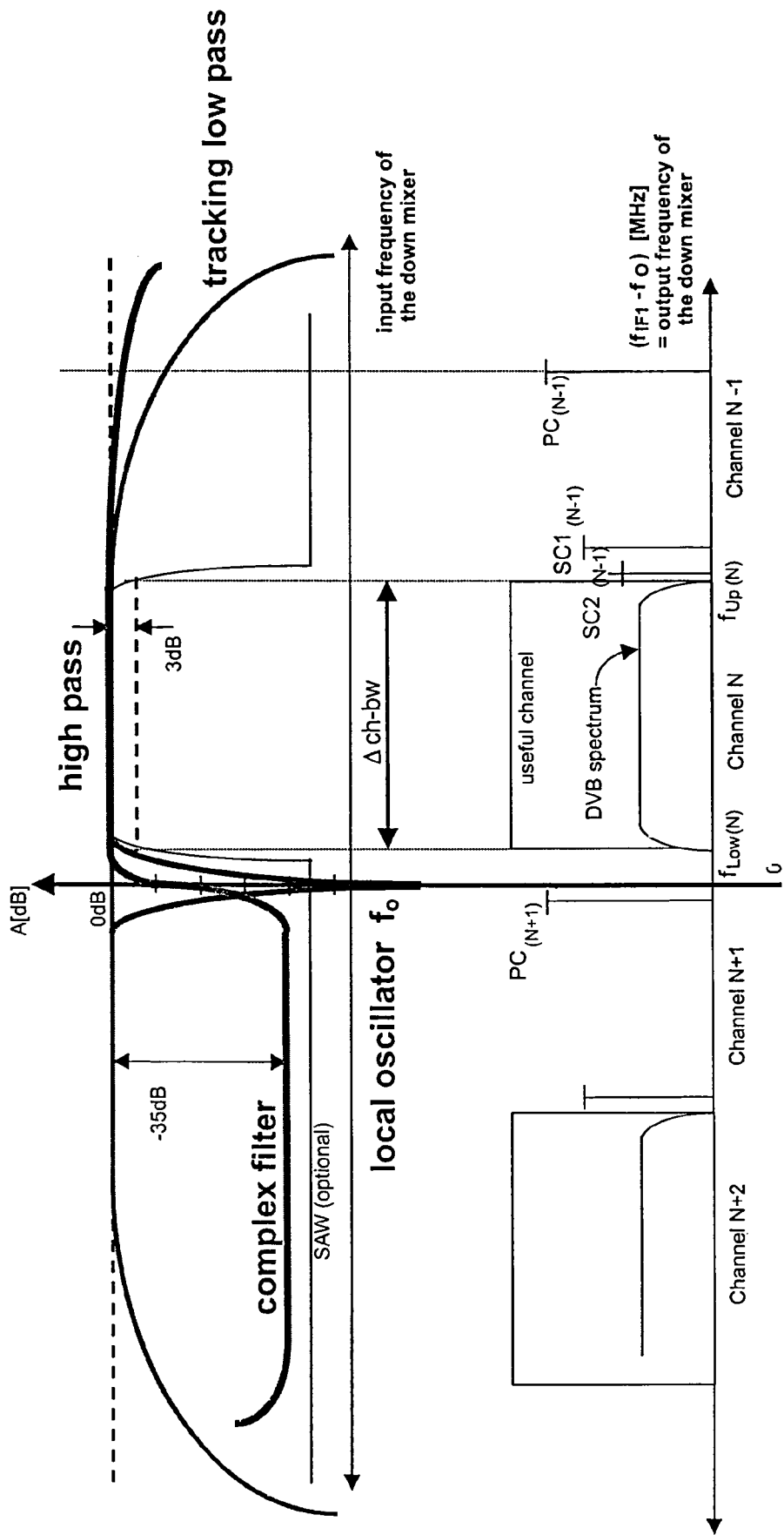
FIG. 3 is a diagram illustrating the operation of individual components of the down-converter of FIG. 1.

FIG. 3 shows, for example, the operation of the individual selection components of the down-converter 6 of FIG. 1, namely of the mixer 10, the complex filter 14, the high-pass filter 16 and the low-pass filter 18. The co-ordinate system A of the diagram of FIG. 3 shows the effects of the individually mentioned sections on the input frequency of the down-converter 6, while the co-ordinate system B of the diagram of FIG. 3 shows the down-converted useful spectrum of a digitally modulated television transmitter in combination with possible analogously modulated adjacent channels. For the sake of clarity, the co-ordinate system B shows the input frequencies below the local oscillator frequency as negative frequencies instead of superimposing them on the positive frequency axis.

It is apparent from the diagram of FIG. 3 that, based on the common function of the complex filter 14 and the high-pass filter 16 with a view to the selected frequency of the local oscillator 12, channel N+1 is suppressed completely and components of channel N+2 are suppressed, while the low-pass filter 18 suppresses a possible analog adjacent picture carrier in channel N−1 as well as the other components of the channels N+/−2 and higher.

Figure 4:
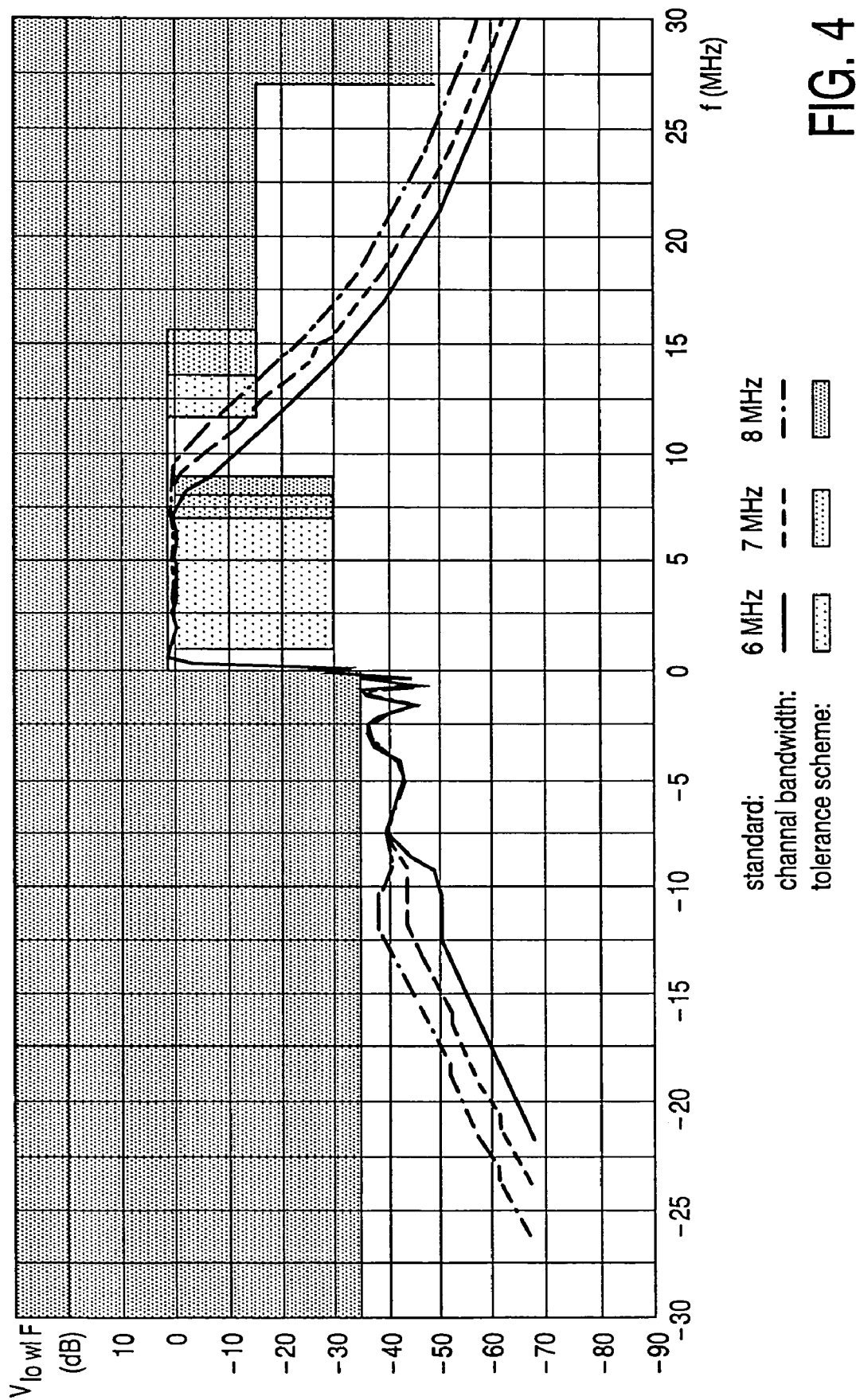
FIG. 4 is a diagram illustrating the operation of the down-converter.

The operation of the superimposed overall selection, which can be achieved in a preferred embodiment of the down-converter 6, is shown by way of example in the diagram of FIG. 4.

The invention claimed is:

1. A down-converter for processing frequency signals, preferably received, particularly digital, television signals, comprising two mixer stages for down-converting the signal, a local oscillator controlling the mixer stages by a 90° phase shift, a complex filter which couples the output signals of the mixer stages by means of a complex filtering method in such a way that the components of the signal outside a predetermined useful band are substantially suppressed; wherein the complex filter comprises an analog phase shifter generating a phase shift between the output signals of the mixer stages by a further 90° in the desired frequency band, and an adder adding the 180° mutually phase shifted output signals of the phase shifter.

2. A down-converter as claimed in claim 1, wherein the phase shifter comprises a first phase shifter branch for processing the output signal of one mixer stage, and a second phase shifter branch for processing the output signal of the other mixer stage.

3. A down-converter as claimed in claim 2, wherein each phase shifter branch comprises at least one all-pass filter.

4. A down-converter as claimed in claim 1, comprising an adjusting device for adjusting the frequency of the local oscillator.

5. A down-converter as claimed in claim 4, wherein the adjusting device comprises a synthesizer, particularly a PLL synthesizer.

6. A down-converter as claimed in claim 4, wherein the adjusting device adjusts the frequency of the local oscillator in such a way that the frequency of the signal component, preferably with a high level, adjacent to the useful band is at least substantially reduced to zero.

7. A down-converter as claimed in claim 4, for processing television signals, wherein the adjusting device adjusts the frequency of the local oscillator to a value of 250 kHz above a possible analog adjacent picture carrier.

8. A down-converter as claimed in claim 1, comprising a high-pass filter which processes the output signals of the filter.

9. A down-converter as claimed in claim 1, comprising a low-pass filter which processes the output signals of the filter.

10. A down-converter as claimed in claim 9, wherein the low-pass filter is connected to the output of the high-pass filter.

11. A down-converter as claimed in claim 9, wherein the filter properties of the low-pass filter are adjustable.

12. A down-converter as claimed in claim 11, wherein the low-pass filter comprises an adjustable tracking low-pass filter.

13. A down-converter as claimed in claim 1, comprising at least one delay equalizer for achieving a desired delay behavior.

14. A down-converter as claimed in claim 13, comprising a delay equalizer acting on the complex filter.

15. A down-converter as claimed in claim 10, comprising a delay equalizer acting on the low-pass filter.

16. A down-converter as claimed in claim 1, comprising a controllable amplifier preceding the mixer stages for adjusting the signal at a predetermined level.

* * * * *